(12) United States Patent
Morozumi et al.

(10) Patent No.: US 6,905,063 B2
(45) Date of Patent: Jun. 14, 2005

(54) METHOD OF MANUFACTURING SEMICONDUCTOR DEVICE

(75) Inventors: Akira Morozumi, Nagano (JP); Tadashi Miyasaka, Nagano (JP); Katsumi Yamada, Nagano (JP); Eiji Mochizuki, Nagano (JP)

(73) Assignee: Fuji Electric Co., Ltd. (JP)

( * ) Notice: Subject to any disclaimer, the term of this patent is extended or adjusted under 35 U.S.C. 154(b) by 6 days.

(21) Appl. No.: 10/400,188

(22) Filed: Mar. 26, 2003

(65) Prior Publication Data

US 2003/0222126 A1 Dec. 4, 2003

(30) Foreign Application Priority Data

Mar. 29, 2002 (JP) ........................................ 2002-094650

(51) Int. Cl.[7] ................ B23K 35/12; B23K 35/38; B23K 31/02
(52) U.S. Cl. .................... 228/246; 228/218; 228/219; 228/220
(58) Field of Search ................. 228/190, 218–221, 228/228, 246; 438/614; 428/457, 615

(56) References Cited

U.S. PATENT DOCUMENTS

| | | | | |
|---|---|---|---|---|
| 4,448,853 A | * | 5/1984 | Fischer et al. | 428/607 |
| 4,614,837 A | * | 9/1986 | Kane et al. | 174/257 |
| 4,645,116 A | | 2/1987 | Henein et al. | 228/123 |
| 4,709,849 A | * | 12/1987 | Socolowski | 228/246 |
| 4,860,942 A | | 8/1989 | Takvorian | 228/220 |
| 5,767,577 A | * | 6/1998 | Nihei et al. | 257/707 |
| 6,090,701 A | * | 7/2000 | Hasunuma et al. | 438/632 |
| 2003/0084894 A1 | * | 5/2003 | Sung | 125/12 |

FOREIGN PATENT DOCUMENTS

| | | |
|---|---|---|
| JP | 7-79071 | 3/1995 |
| JP | 8-242069 | 9/1996 |
| JP | 11-154785 | 6/1999 |
| JP | 11-186331 | 7/1999 |

OTHER PUBLICATIONS

"Fluxless And Substantially Voidless Soldering For Semiconductor Chips"; K. Mizuishi et al.; Proc. Electron Components Conf.; IEEE, May 9, 1988, pp. 330–334; XP010077236, New York, USA.

"A New Void Free Soldering Process in Large–Area, High Power IGBT Modules"; J. Onuki et al.; 12th International Symposium on Power Semiconductor Devices and IC S. ISPSD 2000. Proceedings. Toulouse, France; May 22–25, 2000; International Symposium on Power Semiconductor Device and IC'; New York, NY; IEEE, US, May 22, 2000; pp. 367–370; XP000987886.

"Void Free Die Attachment For Multichip Modules Using Solder Alloys"; P. Barnes; 1998 International conference on Multichip Modules and High Density Packaging; New York, NY, USA; IEEE, USA; Apr. 15, 1998; pp. 435–440; XP002290120.

* cited by examiner

Primary Examiner—L. Edmondson
(74) Attorney, Agent, or Firm—Rossi & Associates

(57) ABSTRACT

A semiconductor device can be formed with fewer voids in the solder bonding a laminate of a silicon chip, an insulator substrate, and a metal base, with a solder layer positioned between the layers. After placing the laminate in a furnace, it is evacuated and then pressurized with hydrogen gas, and then heated to melt the solder. While maintaining the heat, the furnace is again evacuated to remove voids in the solder, and then the furnace is positively pressurized again with hydrogen gas to prevent holes produced by the voids traveling in the solder, and to obtain a uniform solder fillet shape. Thereafter the laminate is rapidly cooled to obtain a finer grain solder to increase the rate of creep to quickly remove the warping of the laminate to the original state.

26 Claims, 14 Drawing Sheets

Ceramic Heat Insulation Wall

Partition Wall (Heat Insulation Wall)

METHOD OF MANUFACTURING SEMICONDUCTOR DEVICE

BACKGROUND

In a power semiconductor device, soldering is achieved by one of the following three ways. In the first method, preliminary soldering is formed in a continuous furnace (a tunnel furnace) in a reducing atmosphere to provide solder on electrodes on a bottom face of a silicon chip. Subsequently, the silicon chip is soldered on an insulator substrate with the solder placed between them. Afterward, wire bonding is done. Then, an element with the silicon chip soldered on the insulator substrate is soldered in the atmosphere onto a metal base made of copper using a flux. In the second method, a silicon chip and an insulator substrate are soldered using the continuous furnace in a reducing atmosphere. Afterward, wire bonding is carried out. Then, an element with the silicon chip soldered on the insulator substrate is soldered onto a metal base using the continuous furnace in the reducing atmosphere. In the third method, by using a reduced pressure furnace in an inert atmosphere, a silicon chip, an insulator substrate, and a metal base are soldered with flux cored solder positioned among them. Afterward, wire bonding is carried out.

In a power semiconductor device, such as a power module, a large current flowing generates significant heat in a silicon chip, as much as several tens to several thousands of watts. To dissipate heat, the power semiconductor device needs to have an excellent heat dissipating capability. Presence of voids in a solder between the silicon chip and the insulator substrate or between the insulator substrate and the metal base prevents heat dissipation, which can damage the semiconductor device. Therefore, it is important to prevent voids in the solder bonded layer.

One of the causes of formation of voids in the solder bonded layer is that gas, such as carbon dioxide gas, dissolved in the solder material remains in the voids formed in the solder when the solder melts. Another cause is that, during soldering, materials adsorbed, on the surfaces of solder, or components to be bonded, such as an insulator substrate, or tin oxide on surfaces of the solder, copper oxide on surfaces of copper pattern or metal base (i.e., copper), nickel oxide on surfaces of nickel plating formed on surfaces of the copper pattern and metal pattern or the like, are reduced, and $H_2O$ produced thereby is gasified and remains in the voids. Another cause is that gasses generated by the flux vaporization also can form voids. Moreover, the flux itself remaining in the solder bonded layer can form voids.

Therefore, to reduce voids in the solder bonded layer, the surfaces of the components to be bonded need to be free of oxidization to keep the surface clean, the solder materials need to be free of dissolved gas, and the solder materials need to have good wetting ability. Moreover, it is desirable to optimize the soldering profile, to control deformation of components to be bonded, and to carry out soldering in a depressurized atmosphere.

In this regard, there have been a number of proposals to improve the soldering technique. For example, JP-A-11-154785 discloses a method in which soldering is done inside a sealed vessel containing an atmosphere of gas having a higher thermal conductivity than that of the air, while reducing pressure prior to heating and melting of the solder, and increasing the pressure higher than the prior pressure before the solder is solidified. In this method, voids are compressed during solidification to reduce their volumes.

In addition, JP-A-779071 discloses a method in which solder is provided on a substrate and electronic parts are temporarily mounted on the solder sections before the solder is heated and melted under an atmosphere of a vacuum to solder the electronic parts. Here, however, no reduction gas, such as hydrogen gas, is used.

Moreover, JP-A-11-186331 discloses a method of manufacturing a semiconductor device, where an insulator substrate having a conductor layer on a metal base is solder bonded and a semiconductor chip is mounted on the insulator substrate. The solder bonding is achieved by melting solder under an atmospheric pressure to form melted solder, reducing the atmospheric pressure on the melted solder, returning the pressure on the melted solder to the atmospheric pressure, and solidifying the melted solder. While this method applies a vacuum operation during solder bonding using a flux, no reference is made about using hydrogen or a reducing atmosphere.

Furthermore, JP-A-5-291314 discloses a method in which, in soldering of a bare chip or the like and a heat spreader, the heat spreader, to which the bare chip is soldered beforehand, is placed in a vacuum heat treatment furnace. Then, furnace is heated while evacuating the furnace to melt the soldered part again. Again, while this method uses a soldering method using flux, no reference is made about using hydrogen or a reducing atmosphere.

In addition, JP-A-8-242069 discloses a method of solder bonding using a soldering apparatus. The soldering apparatus includes a processing vessel, means for controlling an atmosphere and pressure in the processing vessel by producing a low oxygen concentration atmosphere through evacuation and introduction of a high purity gas, and heating means provided in the processing vessel. With the use of the soldering apparatus, the solder bonding is carried out by heating a circuit board with the heating means, and by controlling the pressure of the atmosphere in the processing vessel.

In the above-described first to third methods of manufacturing power semiconductor devices, however, following problems exist. In the first method, the silicon chip is mounted on a jig and the preliminary soldering and soldering of the silicon chip to the insulator substrate are carried out. Because the silicon chips are handled many times, probability of damaging silicon chips is increased, which can degrade electric characteristics. Moreover, in the first and second methods, by a bimetal effect due to difference in coefficient of thermal expansion among the silicon chip, the metal circuit board, and the ceramic, the insulator substrate can warp after soldering. The produced warping creates nonuniform stress in the silicon chip at wire bonding, which can degrade electric characteristics.

Moreover, in the first and third methods, flux must be removed after soldering. Contaminants, such as residues left after cleaning, adhered on the surface of the silicon chip can degrade electric characteristics, such breakdown voltage. Particularly in the third method, since the wire bonding is done after cleaning, adhered flux residue or residue left remaining after the cleaning operation prevents wire bonding sections from forming strong bonding. Thus, it can degrade reliability.

Moreover, the first and third methods use a continuous soldering furnace having a total length close to 10 m. Thus, when the furnace is in operation, gas necessary for soldering such as hydrogen or nitrogen must continuously flow. Moreover, differences in heat capacity among different materials fed into the furnace necessitate control of temperature in the furnace whenever a material is fed. At the start of the furnace operation, much time is spent on reaching uniform temperature and atmosphere in the furnace. This is costly.

Moreover, in the methods of manufacturing power semiconductor device by the above-explained first to third methods, the following heat dissipation problem exists. In the first and second methods, the soldering is carried out under the atmospheric pressure (normal pressure) condition using the continuous furnace. While the solder is melting, the viscous solder or the components to be bonded cuts off void escaping paths in the solder. Therefore, the voids are liable to be left in solder bonded layers. Thus, as explained above, it is necessary to use solder material with less dissolved gas, or to store or pack the solder materials or components to be bonded so that they do not oxidize. This, however, raises the cost of the materials. Moreover, precise control is required for an oxygen concentration, a dew point, and a temperature profile in the soldering furnace, which all significantly increase the operation cost of the soldering furnace.

Furthermore, in the third method, insufficient depressurization leaves traces of removed fluxes, i.e., traces of traveled fluxes, and voids in the solder bonded layer. In addition, removal of all the fluxes by depressurization is very time consuming, thus decreasing productivity in the case of a batch furnace. Moreover, rosin, which is the main ingredient of the flux, can adhere onto the inside of the depressurized chamber or onto piping. This necessitates frequent cleaning of the inside of the apparatus, again raising the cost of maintaining and controlling the apparatus. Further, soldering carried out at 300° C. or higher causes sticking of scorched flux. Thus, soldering is limited to below 300° C.

Accordingly, there is a need for a better and more economical way of manufacturing a semiconductor device, where soldering results in fewer voids. The present invention addresses this need.

SUMMARY OF THE INVENTION

The present invention relates to a method of manufacturing a semiconductor device, and more particularly to a method of manufacturing a power semiconductor device or a power module.

The method can include placing a laminate in a furnace, such as a reduced pressure furnace, The laminate includes at least two components to be bonded with a solder sheet positioned therebetween. The furnace can then be heated to heat the laminate to a bonding temperature and melt the solder sheet. The furnace can be evacuated to create an atmosphere of vacuum while maintaining the bonding temperature to remove voids in the liquefied solder. The furnace then can be pressurized with an atmosphere of hydrogen gas to a positive pressure for a specified length of time.

The furnace can be evacuated and then positively pressurized with the hydrogen gas to reduce at least the surfaces of the laminate to be bonded before heating the laminate to the bonding temperature. The laminate can be heated to the bonding temperature to melt the solder sheet while maintaining the atmosphere of hydrogen gas under the positive pressure. The hydrogen gas fills the voids produced in the liquefied solder when the solder sheet is melting to activate the voids.

The furnace can be evacuated while maintaining the bonding temperature to remove the voids in the liquefied solder. Thereafter, the furnace can be pressurized again with hydrogen gas to a positive pressure, while maintaining the bonding temperature to prevent holes produced by the voids traveling in the liquefied solder, and to uniformly shape a solder fillet thereof. Thereafter, the laminate can be rapidly cooled in the furnace while maintaining the atmosphere of hydrogen gas under the positive pressure. During the cooling step, the solder can be formed with a finer grain by increasing a rate of creep to remove warping of the laminate due to differences in the coefficient of thermal expansion among different components of the laminate. In this respect, the rate of cooling can be maintained at 250° C. or higher per minute. More specifically, the rate of cooling can be maintained at 300° C. or higher per minute. Moreover, the hydrogen gas can be evacuated from the furnace and an atmosphere of nitrogen gas can be pressurized to a positive pressure before opening the furnace. More specifically, the atmosphere of hydrogen gas in the furnace can be replaced with the atmosphere of nitrogen gas when the laminate reaches a temperature of 60° C. or below.

The voids can be further removed by repeating a number of times ranging between one to five, the evacuating and pressurizing steps while maintaining the bonding temperature. Moreover, while the solder sheet is melting, the atmosphere in the furnace can be maintained so that the oxygen concentration in the furnace is kept at 30 ppm or below, and the dew-point thereof is kept at −30° C. or below. More specifically, the oxygen concentration in the furnace can be kept at 10 ppm or below, and the dew-point thereof can be kept at −50° C. or below.

The laminate can be heated with a heating plate in the furnace during the heating step, while the hydrogen gas is uniformly supplied over the heating plate.

DETAILED DESCRIPTION

Figure 1:
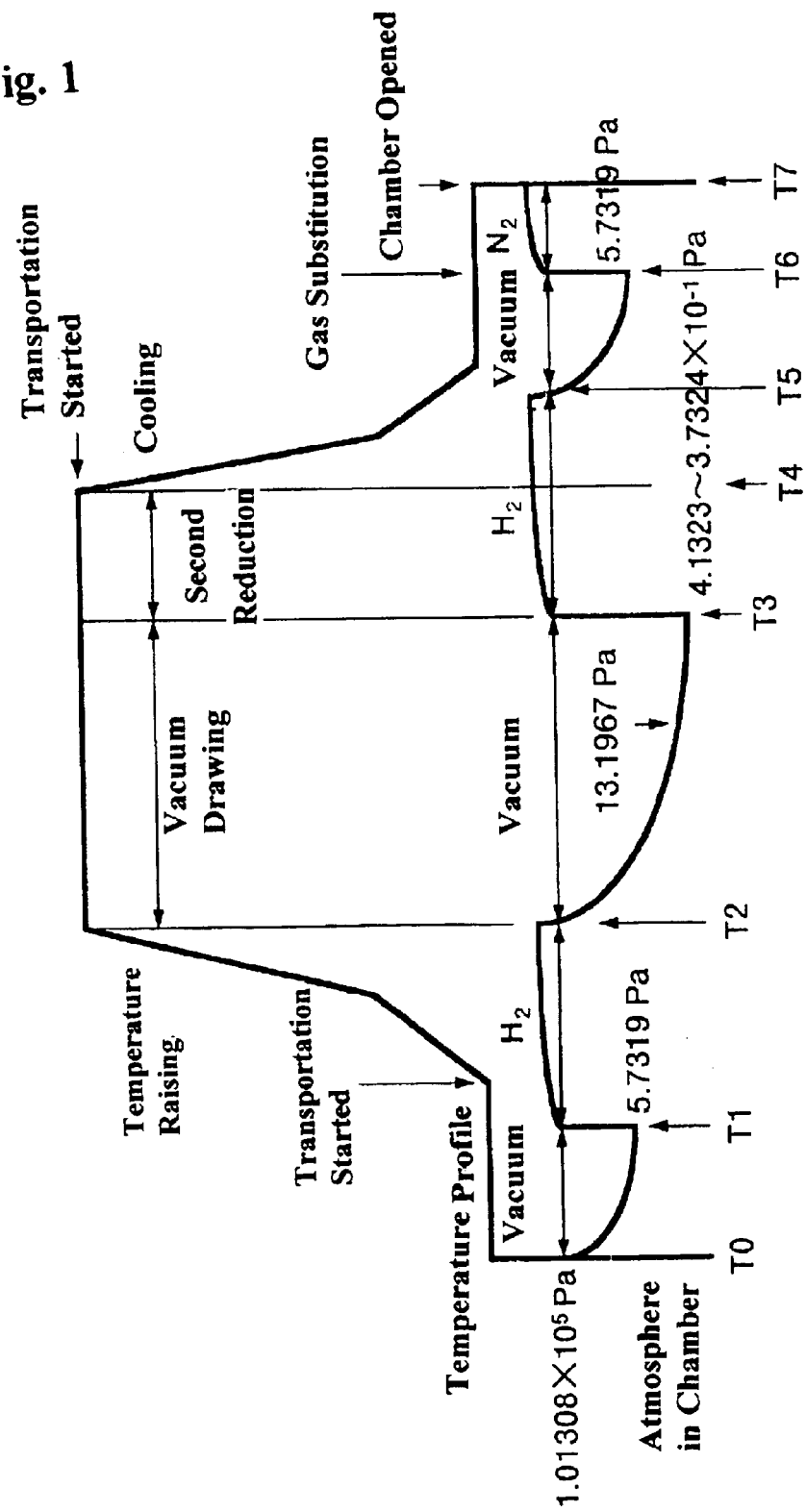
FIG. 1 is a chart showing an example of a temperature profile, atmospheres, and pressures in a chamber according to the method of manufacturing a semiconductor device according to the invention.
Figure 2:
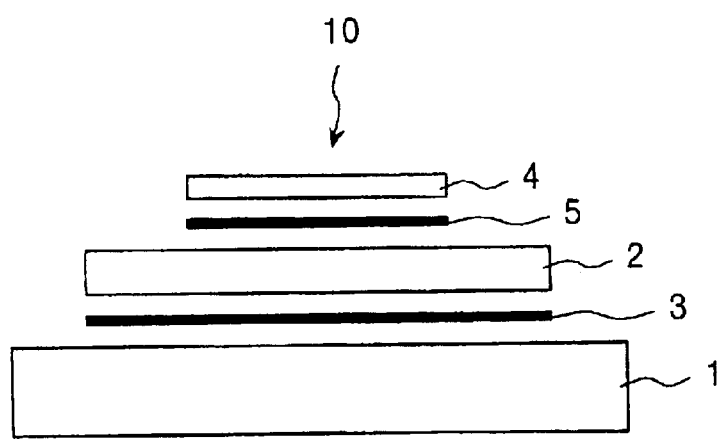
FIG. 2 is a view schematically showing a structure of a laminate to be soldered according to the present method.
Figure 3:
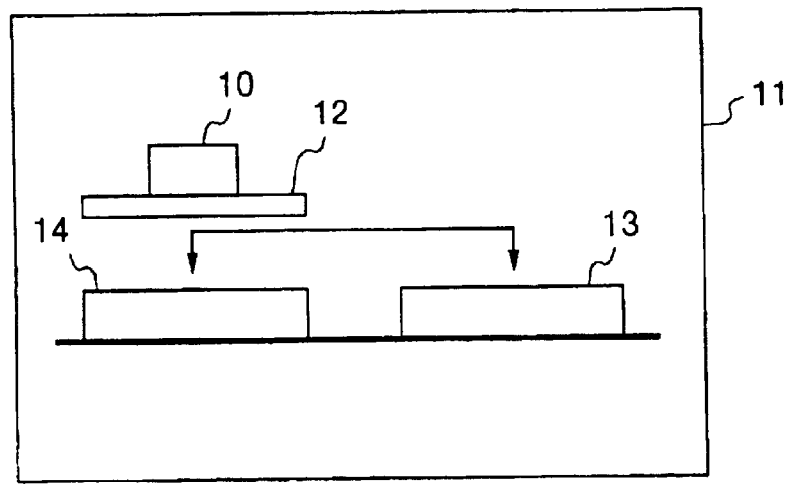
FIG. 3 is a view schematically showing an arrangement inside a reduced pressure furnace of a bonding assembling apparatus that can be used to carry out the method of manufacturing a semiconductor device according to the present invention.

The present invention is explained in detail with reference to the drawings. FIG. 1 is a chart showing an example of a temperature profile, atmospheres, and pressures in a chamber and a processing operation in the method of manufacturing a semiconductor device according to the present invention. First, as shown in FIG. 2, the components to be soldered and bonded are prepared by stacking an insulator substrate 2 on a metal base 1 with a bonding solder sheet 3 sandwiched therebetween. On the insulator substrate 2, a silicon chip 4 is further stacked with another bonding solder sheet 5 sandwiched therebetween. Such a laminate or stack 10, as shown in FIG. 3, is positioned on a transport stage 12 of a reduced pressure furnace 11. The transport stage 12 is a configured to move back and forth between a hot plate 13 for heating the laminate 10 and a water cooling plate 14 for cooling the laminate 10.

When soldering is started according to the chart shown in FIG. 1, with the laminate 10 mounted on the transport stage 12, the reduced pressure furnace 11 is first sealed and depressurized starting at T0. At T0, the transport stage 12 is in a stand-by state and away from both the hot plate 13 and the water cooling plate 14. When a degree of vacuum in the reduced pressure furnace 11 reaches 5.7319 Pa (at T1), for example, hydrogen gas is introduced into the reduced pressure furnace 11. The flow rate of the hydrogen gas can be, for example, 10 liter per second. When the pressure in the reduced pressure furnace 11 becomes a positive pressure, the transport stage 12 is transferred to the hot plate 13, which heats the laminate 10, until the laminate 10 reaches a targeted bonding temperature.

The temperature of the laminate 10 is raised to the targeted bonding temperature during timing T1 to T2. During this stage, since the pressure in the reduced pressure furnace 11 is positive, hydrogen gas can penetrate into clearances between the respective components of the laminate 10. Therefore, the surface of each of the insulator substrate and metal base bonding solder sheet 3, the silicon chip and insulator substrate bonding solder sheet 5, the insulator substrate 2, and the metal base 1 can be actively reduced. Thus, wetting ability of surfaces to be bonded is ensured and the wire-bonding capability is also ensured (first reduction processing). Moreover, as each of the solder sheets 3 and 5 melts, the hydrogen gas fills voids produced at that time to thereby activate the voids. While the solder sheets 3 and 5 are melting, the oxygen concentration in the reduced pressure furnace 11 is kept at 30 ppm or below, preferably at 10 ppm or below, and a dew point is kept at −30° C. or below, preferably at −50° C. or below.

When the temperature reaches the targeted bonding temperature at T2, the furnace is depressurized again until it reaches 13.1967 Pa, for example, and then further depressurization for one minute, for example, and stops at T3. This reduces the pressure in the furnace 11 to about 4.1323 to $3.7324 \times 10^{-1}$ Pa. The one-minute continuation of the depressurization removes almost all of voids produced by insufficient wetting between the solder and the component to be bonded and voids produced by dissolved gas included in the solder material. Here, the reason for stopping vacuum application after one minute is that no further void removing effect can be obtained even if the depressurization is continued for a longer period.

Figure 4:
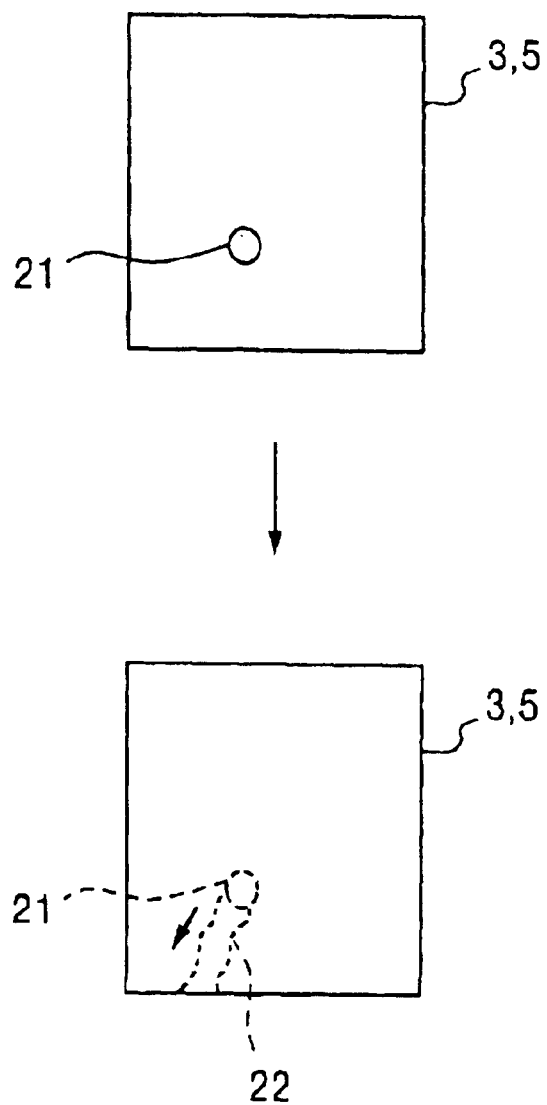
FIG. 4 is a schematic view for explaining a principle of formation of a tunnel-like hole formed in solder as a trace of a traveled void.

After this step, hydrogen gas is introduced into the furnace again, starting at T3. After the pressure inside the reduced pressure furnace 11 reaches a positive pressure, the hydrogen gas is continuously introduced for another one minute (a second reduction processing). The reason for continuing the introduction of the hydrogen gas is to prevent formation of a tunnel-like hole 22 (a trace of traveled void 21), as shown in FIG. 4, caused by the reduction effect of hydrogen. The hole 22 remains in the solder sheet 3 or 5 when the void 21 in the solder sheet 3 or 5 is removed out of the solder sheet 3 or 5 during the above-explained continuation of the one minute depressurization. Namely, the void 21 in the solder sheet 3 or 5 becomes filled with gases of oxidizing components. Thus, a portion in the solder exposed to the void 21 is oxidized when the void 21 passes through therein. This causes the solder in the portion where the void 21 passed through to be unwettable and to leave a tunnel-like opened void in the solder. Hydrogen gas filling the opened void reduces the oxidized inner surface to provide the solder with good wetting ability that results in filling the opened void with the solder.

Figure 5:
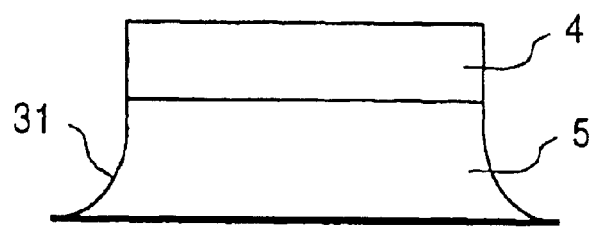
FIG. 5 is a view schematically showing a uniform fillet shape after a second reduction processing.
Figure 6:
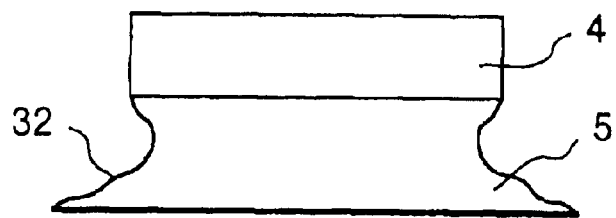
FIG. 6 is a view schematically showing an unpreferable fillet shape before a second reduction processing.

Another reason for continuing introduction of hydrogen gas is to reduce the surface tension of the solder sheet 5 by keeping the reduction with hydrogen gas while heating with the hot plate 13, thereby stabilizing the solder fillet shape 31, as shown in FIG. 5, to lengthen the solder life and to prevent crack generation. Solidification of the solder sheet 5 by cooling, started soon after depressurization of the inside of the furnace without continuing introduction of hydrogen gas, results in nonuniform solder fillet shape 32, as shown in FIG. 6, because of large surface tension of the solder sheet 5. This shortens the solder life and can lead to cracks by thermal cycle and the like. The surface tension of the solder sheet 5 can be reduced by continuously heating the solder sheet 5, increasing the time of exposing the solder sheet 5 to hydrogen gas, or both. However, even though the introduction of hydrogen gas is continued longer than one minute, not much difference is observed in the effect of filling the hole 22 of the trace of the passed void 21 or in the effect of stabilizing the solder fillet shape 31. Therefore, one minute is adequate for continuing the introduction of hydrogen gas.

On finishing the second reduction processing, the transport stage 12 is transferred from the hot plate 13 to the water cooling plate 14, by which cooling of the laminate 10 is started at T4. The laminate 10 is cooled at a rate of, for example, 300° C. per minute. When the temperature of the laminate 10 becomes, for example, 50 to 60° C., hydrogen gas in the reduced pressure furnace 11 is exhausted, starting at T5. When the degree of vacuum in the reduced pressure furnace 11 becomes, for example, 5.7319 Pa by the exhaust of hydrogen, nitrogen gas is introduced into the reduced pressure furnace 11 starting at T6. Moreover, after the atmosphere inside the furnace 11 is substituted with the nitrogen gas, and the hydrogen concentration in the furnace reaches below the explosion limit, the reduced pressure furnace 11 is opened at T7. A series of operations at the timings T0 to T7 in FIG. 1 can be completed within 15 minutes. By the series of operations, a semiconductor device having a high quality solder bonded layer substantially without any void can be formed.

Here, the temperature of the hot plate 13 is preferably higher than a liquidus temperature of solder in the order of 50° C. For example, in the case of using high Pb content solder with a liquidus temperature of 301° C. as the silicon chip and insulator substrate bonding solder sheet 5 and using Sn—Pb solder with a liquidus temperature of 183° C. as the insulator substrate and metal base bonding solder sheet 3, the temperature of the hot plate 13 can be taken as high as 350 to 360° C. with variation within the surface thereof taken into consideration.

Moreover, for example, in the case of using Sn—Ag group solder with a liquidus temperature of 222° C. as the silicon chip and insulator substrate bonding solder sheet 5 and using Sn—Pb solder with a liquidus temperature of 234° C. as the insulator substrate and metal base bonding solder sheet 3, according to the above description, the temperature of the hot plate 13 can be 280 to 290° C. However, by considering that the effect of the reducing power of hydrogen is exhibited at 300° C. or above, the temperature of the hot plate 13 is preferably taken to 300 to 310° C.

The result of examination actually carried out by the inventors has also presented that a combination of high Pb content solder (liquidus temperature: 301° C.) and Sn—Pb solder (liquidus temperature: 183° C.) caused the least numbers of voids in the solder bonded layer when the temperature of the hot plate 13 was at 350 to 360° C. Moreover, a combination of Sn—Ag group solder (liquidus temperature: 222° C.) and Sn—Pb solder (liquidus temperature: 234° C.) caused the least numbers of voids in the solder bonded layer when the temperature of the hot plate 13 was at 300 to 310° C.

Next, regarding the temperature and the cooling time of the water cooling plate 14, they are chosen with a rate of cooling (rate of solidification) of the solder taken into consideration. More specifically, the silicon chip 4, the insulator substrate 2, and the metal base 1, differing in coefficients of expansion from one another, are simultaneously solder-bonded. This, in a completed state of the soldering, causes the metal base 1, having the largest coefficient of thermal expansion, to warp to form a convex configuration toward the side of the insulator substrate 2. This affects the laminate 10, bonded through solder-bonded layers, to warp in the order of 0.3 mm maximum. The warp kept to the next wire bonding step causes failure in electric characteristics as explained above. Therefore, it is necessary to remove the warp before carrying out the wire bonding.

Figure 7:
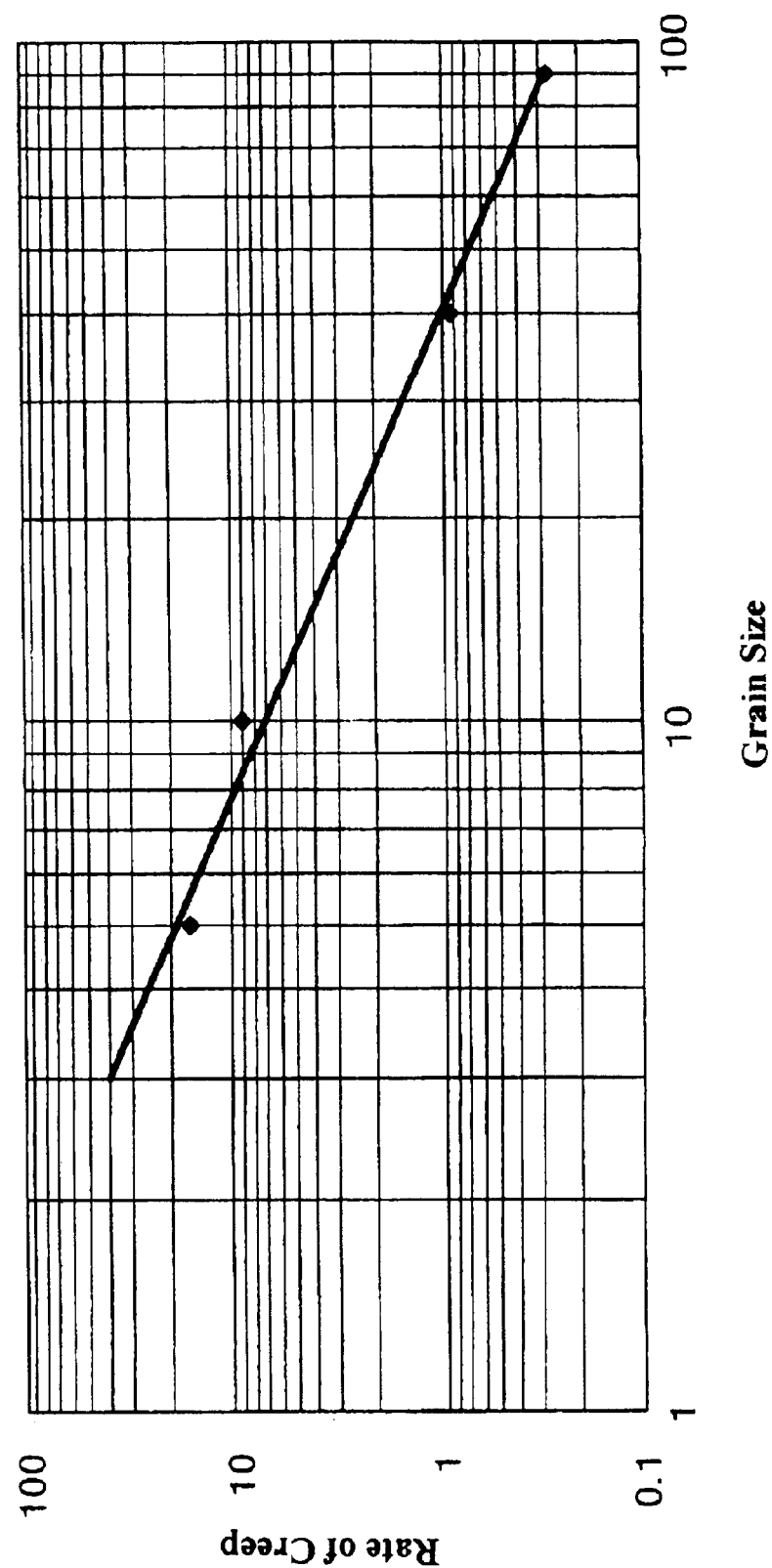
FIG. 7 is a characteristic diagram showing a relationship between a grain size and a rate of creep of solder.
Figure 8:
FIG. 8 is a SEM image of a metal structure of solder cooled at a cooling rate of 600° C. per minute.
Figure 9:
FIG. 9 is a SEM image of a metal structure of solder cooled at a cooling rate of 300° C. per minute.
Figure 10:
FIG. 10 is A SEM image of a metal structure of solder cooled at a cooling rate of 5° C. per minute.
Figure 11:
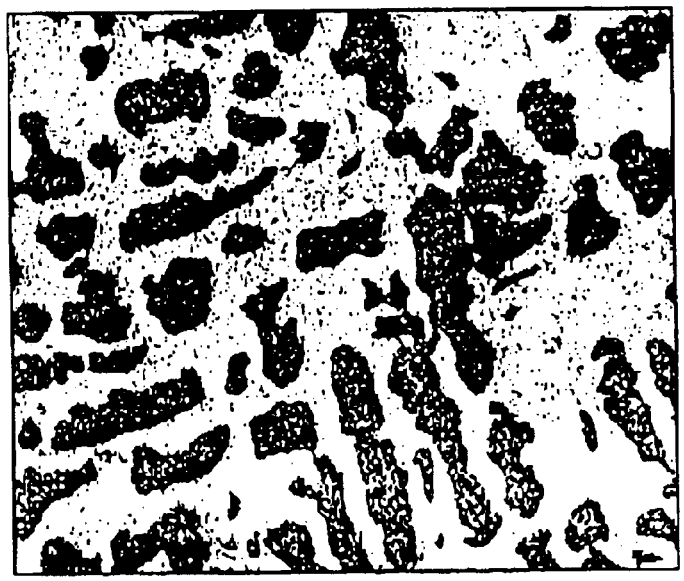
FIG. 11 is A SEM image of a metal structure of solder cooled at a cooling rate of 0.5° C. per minute.

To remove the warp, the solder-bonded layer between the insulator substrate 2 and the metal base 1 can be well subject to a creep in a short time. FIG. 7 is a characteristic diagram showing a relationship between the grain size and the rate of creep of Sn—Pb solder (Sn-37 Pb solder). It is known from the diagram that a rate of creep tends to increase as a diameter of the grain becomes finer. The tendency is the same in a solder material with a different ratio of composition of Sn and Pb. Therefore, by increasing the rate of creep, the metal structure (grain) can be made finer.

Moreover, FIG. 8 to FIG. 11 show SEM images of metal structures of Sn—Pb solder (Sn-37 Pb solder) when the cooling rate is changed. FIGS. 8–11 are images of the metal structures cooled at the cooling rates of 600° C. per minute, 300° C. per minute, 5° C. per minute, and 0.5° C. per minute, respectively. These images reveal that the solder structure becomes finer with an increase in the cooling rate. Therefore, from the relationships of rate of creep to grain size to cooling rate, it is known that the rate of creep can be increased by increasing the cooling rate (rate of solidification) of the solder. Therefore, the cooling rate is preferably taken as 250° C. per minute or more, for example, as 300° C. per minute.

Examinations carried out by the inventors revealed that the cooling rate of 250° C. per minute or more warps the metal base 1 only within a range 0 to −0.1 mm (the sign "−" represents that the warp is convex toward the side of the insulator substrate 2), which can eliminate adverse effect on wire bonding. In other words, the cooling rate of 250° C. per minute or less cannot sufficiently restore the warped metal base 1, adversely affecting the wire bonding. Moreover, by removing at the earliest possible stage the residual stress in the laminate 10 after bonding with a creep of solder, deformation of the metal base 1 can be stabilized. Therefore, the temperature and the cooling time of the water cooling plate 14 can be selected so that the cooling rate of the solder becomes 250° C. per minute or more.

Figure 12:
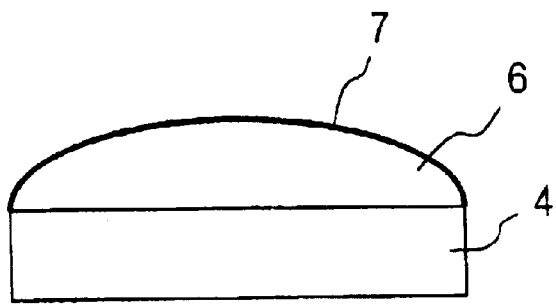
FIG. 12 is a view schematically showing a state in which solder is provided on a bottom face of a silicon chip by preliminary soldering.
Figure 13:
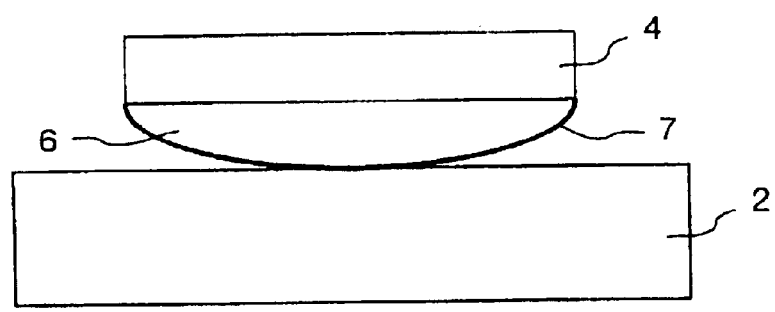
FIG. 13 is a view schematically showing a state of carrying out soldering onto an insulator substrate through the solder provided on the bottom face of the silicon chip by preliminary soldering.

Incidentally, when a silicon chip 4 has a size of 5 mm square or less, a size of the silicon chip and insulator substrate bonding solder sheet 5 is also 5 mm square or less. Such considerably small sizes of the silicon chip and the solder sheet cause preliminary preparation of soldering to be time consuming, or cause insufficient positioning of the silicon chip 4 to the solder sheet 5 that produces possible bonding failure. Thus, when carrying out solder bonding of the silicon chip 4 with such a size, it is desirable to carry out preliminary soldering by using the reduced pressure furnace 11 to provide silicon chip and insulator substrate bonding solder 6 beforehand on the bottom face, for example, a face of a collector electrode, of the silicon chip 4. When particularly using solder having easily oxidized Sn as a principal component and containing no Pb, the oxygen concentration in the reduced pressure furnace 11 is several tens ppm or below. Providing an atmosphere of very-low oxygen can produce the least possible surface oxide film 7 on the solder 6 after preliminary soldering as shown in FIG. 12. Then, as shown in FIG. 13, through the solder 6 provided on the bottom face of the silicon chip 4, the silicon chip 4 is soldered onto the insulator substrate 2.

In addition, in a method of manufacturing a power semiconductor device, when a silicon chip and an insulator substrate are soldered and the soldered components are soldered onto a metal base, the oxygen concentration in a generally used continuous furnace is several thousands ppm. Therefore, in solder having Sn as a principal component and containing no Pb, preliminary soldering using the continuous furnace causes formation of a strong oxide film on the solder. Thus, it is impossible to obtain good solder bonding.

Figure 14:
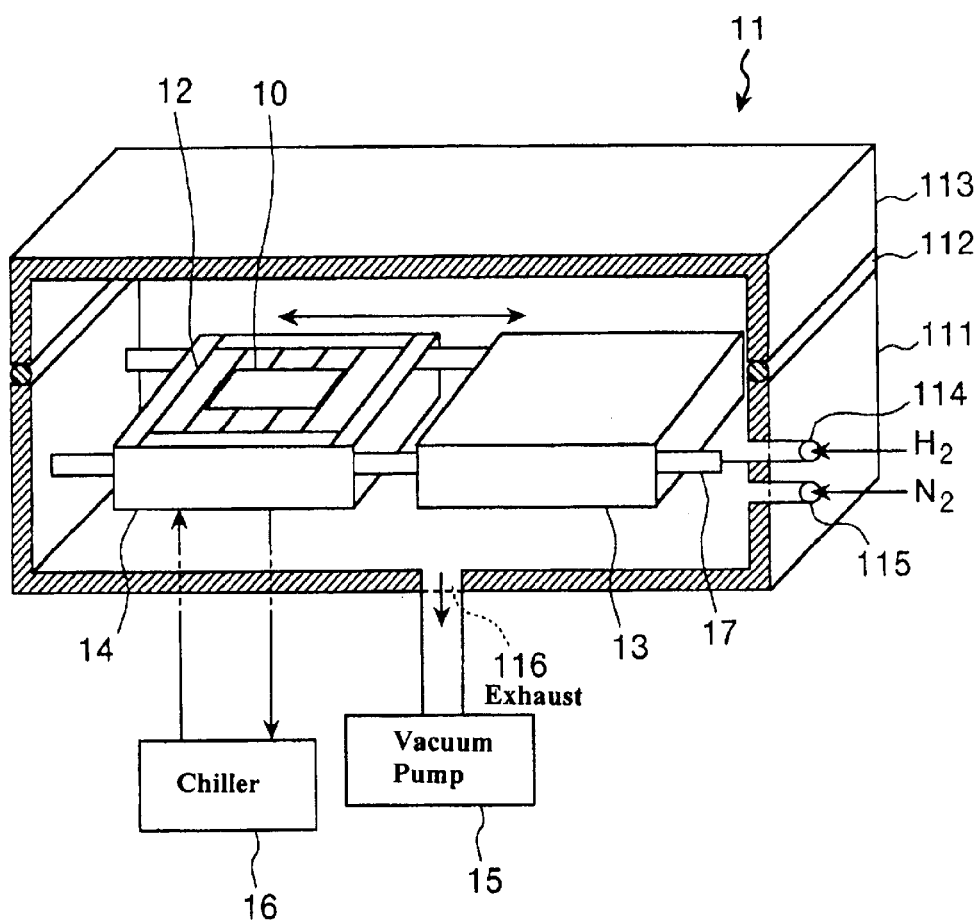
FIG. 14 is a cross sectional view showing an example of an arrangement on the inside of the reduced pressure furnace used for carrying out the method according to the invention.

FIG. 14 is a cross sectional view showing an example of an arrangement on the inside of a reduced pressure furnace.

The reduced pressure furnace 11 includes a furnace main body 111 and a lid 113 put thereon with a packing or seal 112 held between them for keeping the inside of the furnace gas tight. In the reduced pressure furnace 11, there are provided a hydrogen gas introducing pipe 114 for supplying hydrogen gas into the furnace, a nitrogen gas introducing pipe 115 for supplying nitrogen gas into the furnace, and an exhaust hole 116. Although omitted from the figure for ease of illustration, the hydrogen gas introducing pipe 114 is attached onto the rear side of the hot plate 13 in a spiral spreading from the center thereof toward outside. Moreover, an arrangement is provided in which, from a plurality of holes provided on the spiral pipe, hydrogen gas heated by the hot plate 13 for being activated is uniformly blown into the inside of the furnace. This enhances reducing power. The hydrogen gas introducing pipe 114 and the nitrogen gas introducing pipe 115 are connected to a hydrogen gas supplying source and a nitrogen gas supplying source outside of the furnace, respectively, which are not shown in the figure. Moreover, to the exhaust hole 116, a vacuum pump 15 is connected. The water cooling plate 14 is connected to a chiller 16 on the outside of the furnace for circulating cooling water for the water cooling plate 14. Moreover, the transport stage 12 travels along transporting rails 17 between the hot plate 13 and the water cooling plate 14. Note that the temperature of the furnace and the laminate can be monitored using conventional temperature reading means, such as a sensor, thermal sensors, thermocouple, etc.

Figure 15:
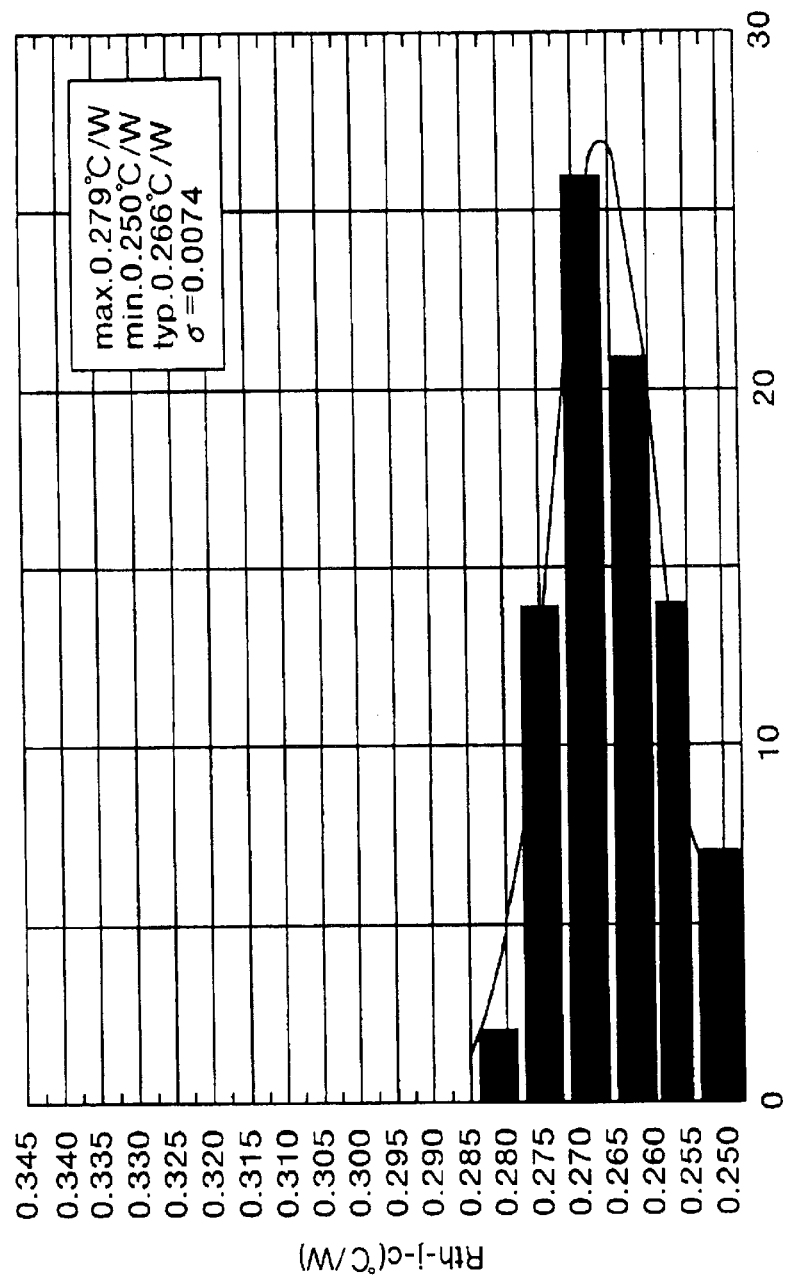
FIG. 15 is a characteristic diagram showing a thermal resistance distribution in a plurality of semiconductor devices manufactured according to the present method.
Figure 17:
FIG. 17 is a characteristic diagram showing thermal resistance distribution in a plurality of semiconductor devices manufactured according to a first conventional method.

FIG. 15 shows an example of thermal resistance distribution in a plurality of semiconductor devices manufactured by the present method. For comparison, FIG. 17, shows an example of thermal resistance distribution in a plurality of semiconductor devices manufactured by the first method of the above-explained prior art. As is apparent from FIG. 15, an averaged value, the maximum value, and the minimum value of the thermal resistance distribution are 0.266° C./W, 0.279° C./W, and 0.250° C./W, respectively. In addition, the standard deviation is 0.0074.

Compared with this, in the conventional first method, the averaged value, the maximum value, the minimum value, and the standard deviation of the thermal resistance distribution are 0.287° C./W, 0.334° C./W, and 0.272° C./W, and 0.0103, respectively. From the comparison of the two, it is understood that values of thermal resistance and the deviation thereof are apparently smaller in the semiconductor device manufactured according to the present method. Namely, it was ascertained that a void fraction in a solder bonded layer and the deviation thereof can be made smaller according to the present method than those by the conventional method to thereby enable to enhance heat dissipation of the semiconductor device.

According to the above-explained mode, the insulator substrate and metal base bonding solder sheet 3, the insulator substrate 2, the silicon chip and insulator substrate bonding solder sheet 5, and the silicon chip 4 are laminated in that order on the metal base 1. The laminate 10 is fed into the bonding assembling apparatus provided with the reduced pressure furnace 11. After evacuating the furnace, the surface of each of the components included in the laminate 10 is reduced by pressuring with an atmosphere of hydrogen under a positive pressure. After the solder is heated and melted, the voids in the solder sheets 3 and 5 are removed by evacuating the furnace to form the atmosphere of vacuum again. Subsequently, the inside of the furnace is brought into the atmosphere of hydrogen gas under the positive pressure again to prevent the tunnel-like holes 22 produced in the solder sheets 3 and 5 by traveled voids 21. This method beneficially creates uniformly formed solder fillet shape 31. Thereafter, the laminate 10 is rapidly cooled to make solder structure finer. This increases the rate of creep of the solder that bonds the insulator substrate 2 and the metal base 1 to quickly reduce the warping of the metal base 1 caused by differences in the coefficient of thermal expansion, to return to its original state. Therefore, within ten and some odd minutes after starting the operation of the reduced pressure furnace 11, a semiconductor device having a solder bonded layer with higher quality and reliability, and with better heat dissipation than conventional one can be obtained.

Moreover, according to the prevent method, compared with prior art, less amounts of hydrogen gas and nitrogen gas is required, and no flux is needed. Therefore, the present method can reduce operation cost.

Figure 16:
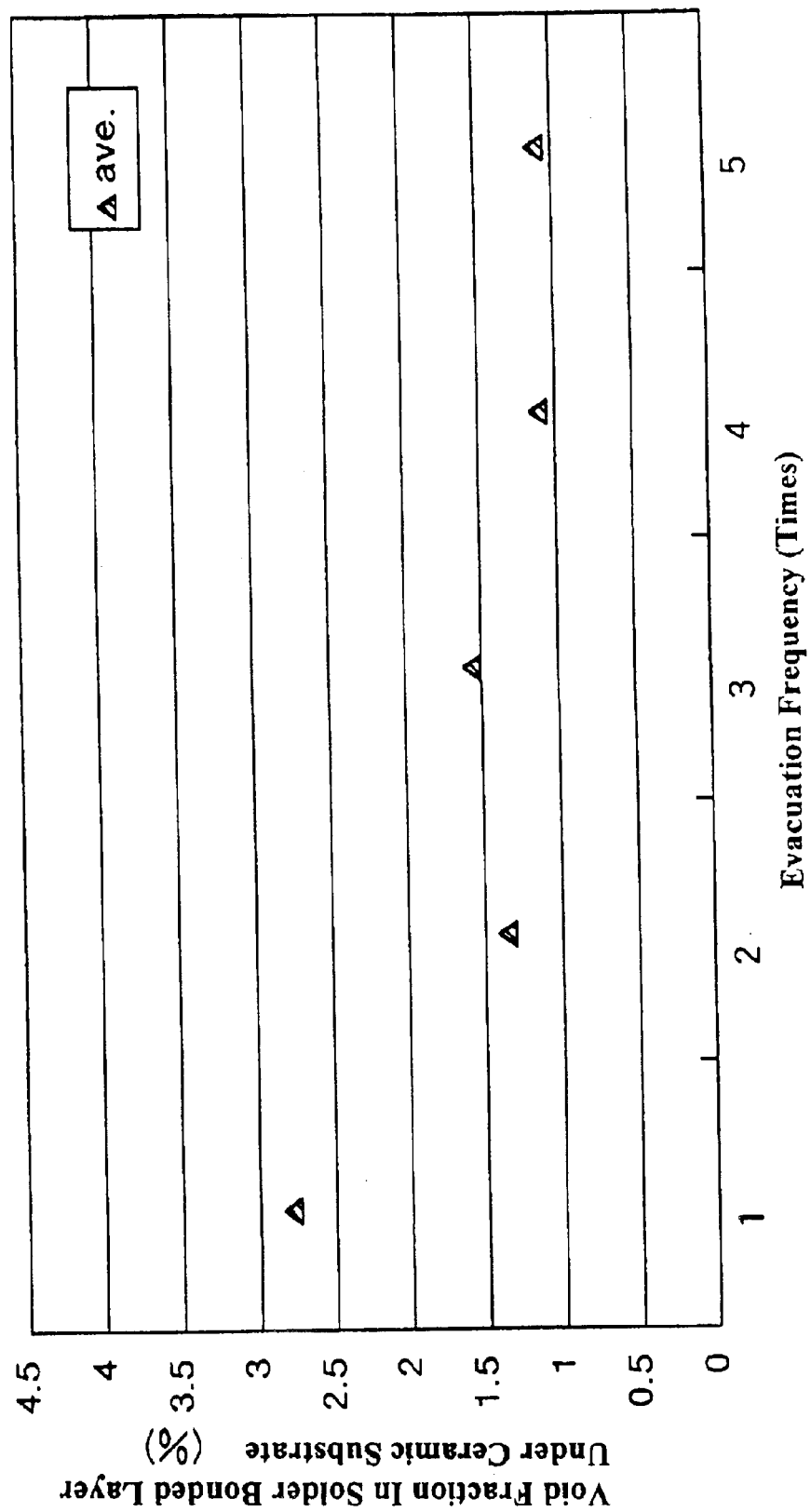
FIG. 16 is a characteristic diagram showing a relationship between a frequency of evacuation and a void fraction in a solder bonded layer formed according to the present method.

In the foregoing, the present invention should not be limited to the disclosed example, but can be variously modified. For example, a frequency of the evacuation steps within the timings T2 to T3 in FIG. 1 is normally taken as one time. However, when a large area substrate is bonded, or when the voids are not easily removed, the evacuation and pressurizing steps can be repeated as necessary, such as 2 to 5 times, for example. With depressurization and pressurization repeated in this way, melting solder is stirred to remove more difficult to remove voids. However, as shown in FIG. 16, the result of investigation carried out by the inventors about the relationship between the frequency of evacuation and the void fraction in the solder bonded layer, with a repetition frequency of the evacuation steps up to five times, the void fraction becomes smaller with an increase in the frequency, but even with a frequency of six times or more, no further beneficial effect can be obtained.

Figure 18:
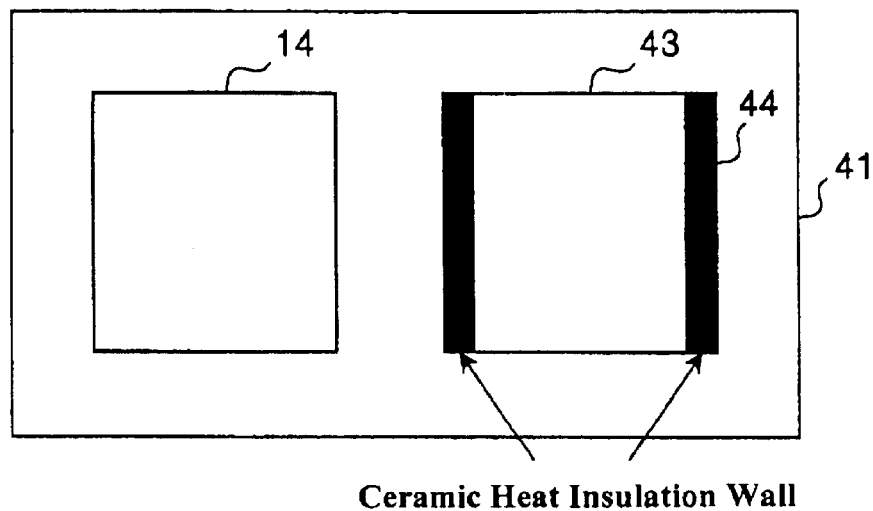
FIG. 18 is an explanatory view showing an example for eliminating portions with non-uniform temperature in a hot plate and a cooling plate.
Figure 19:
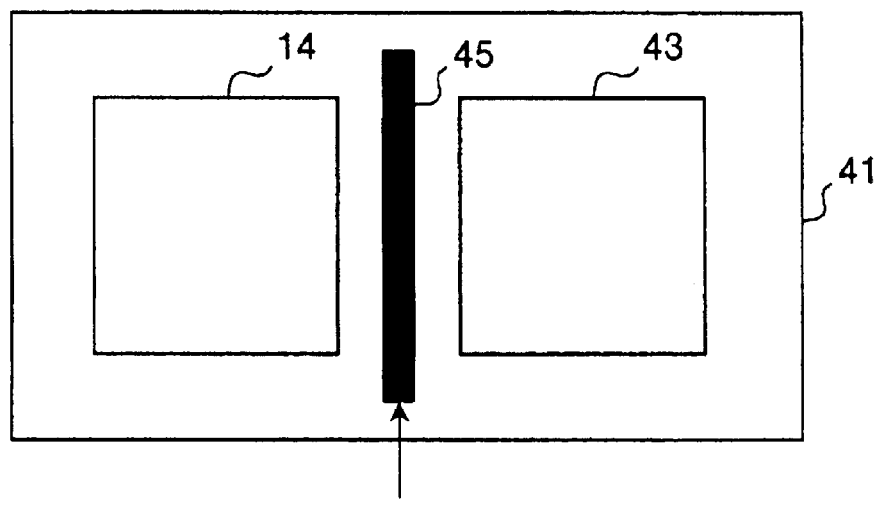
FIG. 19 is an explanatory view showing another example for eliminating portions with non-uniform temperature in a hot plate and a cooling plate.
Figure 20:
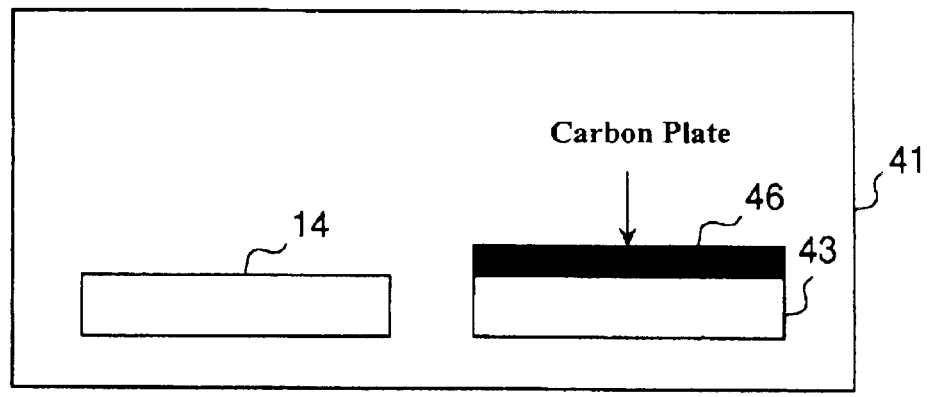
FIG. 20 is an explanatory view showing another example for eliminating portions with non-uniform temperature in a hot plate and a cooling plate.
Figure 21:
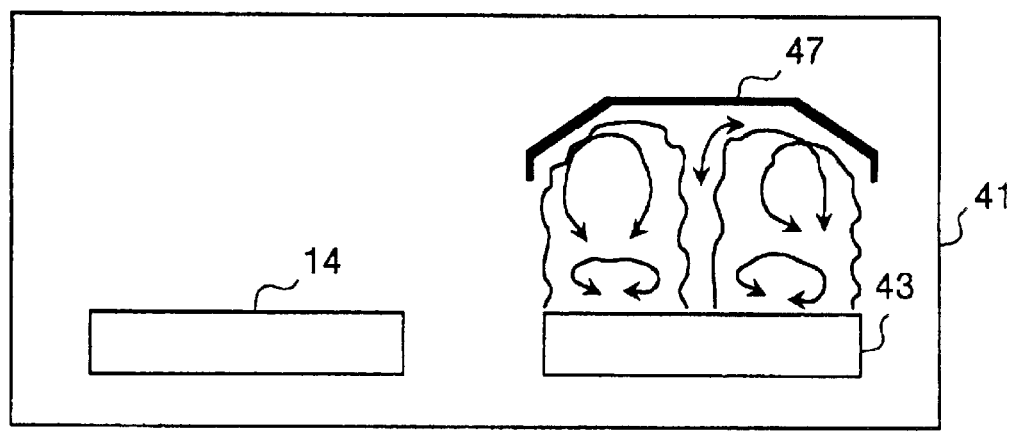
FIG. 21 is an explanatory view showing another example for eliminating portions with non-uniform temperature in a hot plate and a cooling plate.

Furthermore, in an assembling apparatus including in a reduced pressure furnace a hot plate provided with a heater for melting solder, a water cooling plate provided with a cooling water circulating path for cooling the solder, and a transport stage for melting and solidifying the solder, the hot plate and the cooling plate are to be disposed in close proximity to each other in the reduced pressure furnace. Therefore, in portions opposite to each other, the portion of the hot plate is affected by the cooling plate to become a portion whose temperature is low. While, the portion of the cooling plate is affected by the hot plate to become a portion whose temperature is high. Examples for eliminating the portion with such non-uniform temperature are shown in FIG. 18 to FIG. 21. In FIG. 18, a thermal insulation is applied by providing ceramic walls 44 on the outer periphery of a hot plate 43 in the reduced pressure furnace to prevent thermal interference. Moreover, in FIG. 19, a partition wall 45 is provided between the hot plate 43 and the cooling plate 14 to prevent thermal interference. In this case, for the partition wall 45, iron group materials and ceramic materials are suitable. In FIG. 20, a carbon plate 46 with a thickness of 2 to 3 mm is laid on the hot plate 43. The carbon plate 46, being a material easy to be heated and hard to be cooled, exhibits a heat reserving effect and an effect of uniformly keeping an inside temperature of the hot plate 43. Thus, substantially no heat in the hot plate 43 is taken by the cooling plate 14. In FIG. 21, a heat shield plate 47 is provided above the hot plate 43 to thereby making active hydrogen stay around the hot plate 43. This arrangement enhances the hydrogen activation effect at soldering and insulates heated hydrogen gas around the hot plate 43.

According to the present invention, solder bonding of a metal base and an insulator substrate, and solder bonding of the insulator substrate and a silicon chip can be simultaneously performed. Along with this, voids in solder can be removed at that time, and warping of the metal base caused by bonding of different kinds of materials is quickly removed. Therefore, within ten and some odd minutes after starting operation of a reduced pressure furnace, a semiconductor device having solder bonded layers having higher quality and higher reliability and is better in heat dissipation than conventional ones can be obtained. Moreover, the present invention reduces the operation cost and prevents an adverse impact on the environment.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP PA 2002-094650, in its entirety, including the drawings, claims, and the specification thereof, is incorporated herein by reference.

What is claimed is:

1. A method of manufacturing a semiconductor device comprising the steps of:
    placing a laminate into a furnace, the laminate including at least two components to be bonded with a solder sheet positioned therebetween;
    evacuating the atmosphere in the furnace to reduce the pressure;
    pressurizing the furnace with an atmosphere of hydrogen gas to a positive pressure to reduce at least the surfaces of the laminate to be bonded; and
    heating the laminate to a bonding temperature to melt the solder sheet while maintaining the atmosphere of hydrogen gas under the positive pressure.

2. A method of manufacturing a semiconductor device according to claim 1, wherein the furnace is pressurized with the hydrogen gas to fill voids produced in liquefied solder when the solder sheet is melting with hydrogen gas to activate the voids.

3. A method of manufacturing a semiconductor device according to claim 2, further including the step of evacuating the furnace while maintaining the bonding temperature to remove the voids in the liquefied solder.

4. A method of manufacturing a semiconductor device according to claim 3, further including the step of pressurizing the furnace with the atmosphere of hydrogen to a positive pressure, while maintaining the bonding temperature to prevent holes produced by the voids traveling in the liquefied solder, and to uniformly shape a solder fillet thereof.

5. A method of manufacturing a semiconductor device according to claim 4, further including the step of rapidly cooling the laminate in the furnace while maintaining the atmosphere of hydrogen gas under the positive pressure.

6. The method of manufacturing a semiconductor device according claim 5, wherein during the cooling step, the solder is formed with a finer grain by increasing a rate of creep to remove warping of the laminate due to differences in the coefficient of thermal expansion among different components of the laminate.

7. The method of manufacturing a semiconductor device according claim 6, further including the steps of:
    evacuating the hydrogen gas from the furnace during the cooling step; and
    pressurizing the furnace with an atmosphere of nitrogen gas to a positive pressure before opening the furnace.

8. The method of manufacturing a semiconductor device according claim 5, wherein the laminate is heated with a heating plate in the furnace during the heating step, while the hydrogen gas is uniformly supplied over the heating plate.

9. The method of manufacturing a semiconductor device according claim 5, wherein the voids are further removed by repeating a number of times ranging between one to five, the evacuating and pressurizing steps while maintaining the bonding temperature.

10. The method of manufacturing a semiconductor device according to claim 5, wherein while the solder sheet is melting, the atmosphere in the furnace is maintained so that an oxygen concentration in the furnace is kept at 30 ppm or below, and a dew-point thereof is kept at −30° C. or below.

11. The method of manufacturing a semiconductor device according claim 10, wherein the oxygen concentration in the furnace is kept at 10 ppm or below, and a dew-point thereof is kept at −50° C. or below.

12. The method of manufacturing a semiconductor device according to claim 5, wherein the rate of cooling during the cooling step is maintained at 250° C. or higher per minute.

13. The method of manufacturing a semiconductor device according to claim 12, wherein the rate of cooling is maintained at 300° C. or higher per minute.

14. The method of manufacturing a semiconductor device according to claim 7, wherein the atmosphere of hydrogen gas in the furnace is replaced with the atmosphere of nitrogen gas when the laminate reaches a temperature of 60° C. or below.

15. The method of manufacturing a semiconductor device according to claim 1, further including the step of evacuating the furnace while maintaining the temperature of the laminate at the bonding temperature to further remove voids in the liquefied solder.

16. The method of manufacturing a semiconductor device according a claim 15, further including the step of pressurizing the furnace with the atmosphere of hydrogen gas to a positive pressure while maintaining the bonding temperature.

17. The method of manufacturing a semiconductor device according to claim 16, wherein the voids are further removed by repeating a number of times ranging between one to five, the evacuating and pressurizing steps, while maintaining the bonding temperature.

18. The method of manufacturing a semiconductor device according claim 1, wherein while the solder sheet is melting, the atmosphere in the furnace is maintained so that an oxygen concentration in the furnace is kept at 30 ppm or below, and a dew-point thereof is kept at −30° C. or below.

19. The method of manufacturing a semiconductor device according to claim 18, wherein the oxygen concentration in the furnace is kept at 10 ppm or below, and the dew-point thereof is kept at −50° C. or below.

20. A method of manufacturing a semiconductor device comprising the steps of:
    placing a laminate in a furnace, the laminate including at least two components to be bonded with a solder sheet positioned therebetween;
    heating the furnace to heat the laminate to a bonding temperature and melt the solder sheet;
    evacuating the furnace to create an atmosphere of vacuum while maintaining the bonding temperature to remove voids in the liquefied solder; and
    pressurizing the furnace with an atmosphere of hydrogen gas to a positive pressure for a specified length of time.

21. The method of manufacturing a semiconductor device according claim 20, wherein the laminate is heated with a heating plate in the furnace while uniformly supplying the hydrogen gas over the heating plate.

22. The method of manufacturing a semiconductor device according to claim 20, wherein the voids in the liquefied solder is further removed by repeating a number of times ranging between one to five, the evacuating step and the pressurizing step while maintaining the bonding temperature.

23. The method of manufacturing a semiconductor device according claim 20, wherein while the solder sheet is melting, the atmosphere in the furnace is maintained so that an oxygen concentration in the furnace is kept at 30 ppm or below, and a dew-point thereof is kept at −30° C. or below.

24. The method of manufacturing a semiconductor device according to claim 23, wherein the oxygen concentration in the furnace is kept at 10 ppm or below, and the dew-point thereof is kept at −50° C. or below.

25. A method of manufacturing a semiconductor device comprising the steps of:

placing a laminate into a furnace, the laminate including at least two components to be bonded with a wider sheet positioned therebetween;

evacuating the atmosphere in the furnace to reduce the pressure;

pressurizing the furnace with an atmosphere of hydrogen gas to a positive pressure to reduce at least the surfaces of the laminate to be bonded;

heating the laminate to a bonding temperature to melt the solder sheet while maintaining the atmosphere of hydrogen gas under the positive pressure; and cooling the laminate in the furnace at a rate of 250° C. or higher per minute.

26. A method of manufacturing a semiconductor device comprising the steps of:

placing a laminate in a furnace, the laminate including at least two components to be bonded with a solder sheet positioned therebetween;

heating the furnace to heat the laminate to a bonding temperature and melt the solder sheet;

evacuating the furnace to create an atmosphere of vacuum while maintaining the bonding temperature to remove voids in the liquefied solder;

pressurizing the furnace with an atmosphere of hydrogen gas to a positive pressure for a specified length of time; and cooling the laminate in the furnace at a rate of 250° C. or higher per minute.

* * * * *